US012575204B2

(12) United States Patent
Liu et al.

(10) Patent No.: US 12,575,204 B2
(45) Date of Patent: Mar. 10, 2026

(54) SENSOR PACKAGE STRUCTURE AND MANUFACTURING METHOD THEREOF

(71) Applicant: TONG HSING ELECTRONIC INDUSTRIES, LTD., Taoyuan City (TW)

(72) Inventors: Yu-Hsiang Liu, Taoyuan City (TW); Li-Chun Hung, Taoyuan City (TW)

(73) Assignee: TONG HSING ELECTRONIC INDUSTRIES, LTD., Taoyuan City (TW)

( * ) Notice: Subject to any disclaimer, the term of this patent is extended or adjusted under 35 U.S.C. 154(b) by 110 days.

(21) Appl. No.: 18/795,125

(22) Filed: Aug. 5, 2024

(65) Prior Publication Data

US 2025/0366237 A1     Nov. 27, 2025

(30) Foreign Application Priority Data

May 23, 2024     (TW) ................................. 113119037

(51) Int. Cl.
*H10F 39/00*          (2025.01)
(52) U.S. Cl.
CPC ......... *H10F 39/806* (2025.01); *H10F 39/024* (2025.01); *H10F 39/026* (2025.01); *H10F 39/804* (2025.01)
(58) Field of Classification Search
CPC .... H10F 39/806; H10F 39/024; H10F 39/026; H10F 39/804
See application file for complete search history.

(56) References Cited

U.S. PATENT DOCUMENTS

| | | | |
|---|---|---|---|
| 6,492,699 B1 | 12/2002 | Glenn et al. | |
| 9,608,029 B2 | 3/2017 | Wong | |
| 10,692,907 B2 * | 6/2020 | Wu .......................... | H10F 39/18 |
| 10,868,062 B2 | 12/2020 | Lee et al. | |
| 11,177,301 B2 | 11/2021 | Tan et al. | |
| 11,227,777 B2 * | 1/2022 | Kaeding ............. | H01L 23/3178 |
| 2023/0036239 A1 | 2/2023 | Espiritu et al. | |
| 2023/0275108 A1 | 8/2023 | Otsuka et al. | |

FOREIGN PATENT DOCUMENTS

| | | |
|---|---|---|
| CN | 112635505 A | 4/2021 |
| WO | WO2022024972 A1 | 2/2022 |

* cited by examiner

*Primary Examiner* — Seung C Sohn
(74) *Attorney, Agent, or Firm* — Li & Cai Intellectual Property Office

(57)          ABSTRACT

A sensor package structure and a manufacturing method thereof are provided. The sensor package structure includes a substrate, a sensor chip mounted on the substrate, a ring-shaped supporting layer disposed on the sensor chip, a light-permeable sheet disposed on the ring-shaped supporting layer, and an encapsulant formed on the substrate. The top portion of the light-permeable sheet has an avoidance slot formed on an outer edge thereof. The encapsulant is formed by a solidified liquid compound and is not located in the avoidance slot. The encapsulant includes an adhesive and a plurality of fillers mixed in the adhesive. The encapsulant has a filler settling boundary through the precipitation of the fillers. The inner edge of the filler settling boundary is not in contact with the light-permeable sheet and surrounds at an outer side of the avoidance slot.

20 Claims, 16 Drawing Sheets

SENSOR PACKAGE STRUCTURE AND MANUFACTURING METHOD THEREOF

CROSS-REFERENCE TO RELATED PATENT APPLICATION

This application claims the benefit of priority to Taiwan Patent Application No. 113119037, filed on May 23, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure and a manufacturing method thereof.

BACKGROUND OF THE DISCLOSURE

When an encapsulant of a conventional sensor package structure is formed by solidifying a liquid compound covering a surrounding lateral surface of a light-permeable layer, the surrounding lateral surface of the light-permeable layer can easily crack due to a stress of the encapsulant concentrated on the surrounding lateral surface.

SUMMARY OF THE DISCLOSURE

In response to the above-referenced technical inadequacies, the present disclosure provides a sensor package structure and a manufacturing method thereof for effectively improving on the issues associated with conventional sensor package structures.

In order to solve the above-mentioned problems, one of the technical aspects adopted by the present disclosure is to provide a manufacturing method of a sensor package structure, including: a formation step, a filling step, a slicing step, a placing step, a packaging step, and a removing step. The formation step is implemented by recessing an outer surface of a light-permeable board to form a plurality of grooves. The light-permeable board has an inner surface opposite to the outer surface, and defines a plurality of light-permeable sheets through the grooves. The filling step is implemented by forming a sacrificial layer on the light-permeable board. The sacrificial layer is filled in an entirety of each of the grooves and covers the outer surface. The slicing step is implemented by slicing the sacrificial layer and the light-permeable board along the grooves to form the light-permeable sheets separated from each other and a plurality of sacrificial sheets that are respectively attached onto the light-permeable sheets. Each of the light-permeable sheets has an avoidance slot that is arranged on a peripheral side of the outer surface and that is ring-shaped. The avoidance slot of each of the light-permeable sheets is fully filled with a corresponding one of the sacrificial sheets. The placing step is implemented by providing a substrate, a sensor chip mounted on and electrically coupled to the substrate, and a ring-shaped supporting layer that is disposed on the sensor chip, and is implemented by placing the inner surface of one of the light-permeable sheets onto the ring-shaped supporting layer. The packaging step is implemented by arranging a liquid compound on the substrate and solidifying the liquid compound to form an encapsulant that includes an adhesive and a plurality of fillers mixed in the adhesive. The encapsulant is divided into a first segment and a second segment. The first segment is formed on the substrate. The fillers are precipitated in the first segment, and the sensor chip, the ring-shaped supporting layer, and the light-permeable sheet are embedded in the first segment. The second segment is integrally connected to the first segment so as to form a filler settling boundary along a connection interface of the first segment and the second segment. The second segment is connected to a lateral side of the sacrificial sheet, and an inner edge of the filler settling boundary is not in contact with the light-permeable sheet and surrounds the lateral side of the sacrificial sheet. The removing step is implemented by removing the sacrificial sheet, whereby the substrate, the sensor chip, the ring-shaped supporting layer, the light-permeable sheet, and the encapsulant are jointly defined as a sensor package structure.

In order to solve the above-mentioned problems, another one of the technical aspects adopted by the present disclosure is to provide a sensor package structure, which includes a substrate, a sensor chip, a ring-shaped supporting layer, a light-permeable sheet, and an encapsulant. The sensor chip is disposed on and electrically coupled to the substrate. Moreover, a top surface of the sensor chip has a sensing region and a carrying region that surrounds the sensing region. The ring-shaped supporting layer is disposed on the carrying region of the sensor chip and surrounds the sensing region. The light-permeable sheet has an outer surface, an inner surface opposite to the outer surface, a surrounding lateral surface arranged between the inner surface and the outer surface, and an avoidance slot that is ring-shaped and that is connected to the outer surface and the surrounding lateral surface. The light-permeable sheet is disposed on the ring-shaped supporting layer along a predetermined direction through the inner surface, and the light-permeable sheet, the ring-shaped supporting layer, and the top surface of the sensor chip jointly define an enclosed space. The encapsulant is a solidified liquid compound including an adhesive and a plurality of fillers mixed in the adhesive. The encapsulant is not arranged in the avoidance slot, and is divided into a first segment and a second segment. The first segment is formed on the substrate, and the fillers are precipitated in the first segment. The sensor chip, the ring-shaped supporting layer, and the light-permeable sheet are embedded in the first segment, and the surrounding lateral surface of the light-permeable sheet is entirely connected to the first segment. The second segment is integrally connected to the first segment so as to form a filler settling boundary along a connection interface of the first segment and the second segment. Moreover, an inner edge of the filler settling boundary is not in contact with the surrounding lateral surface of the light-permeable sheet and surrounds an outer side of the avoidance slot.

In order to solve the above-mentioned problems, yet another one of the technical aspects adopted by the present disclosure is to provide a manufacturing method of a sensor package structure, which includes: a formation step, a filling step, a slicing step, a placing step, a packaging step, and a removing step. The formation step is implemented by recessing an outer surface of a light-permeable board to form a plurality of grooves. The light-permeable board has an inner surface opposite to the outer surface, and defines a plurality of light-permeable sheets through the grooves. The filling step is implemented by forming a sacrificial layer on the light-permeable board. The sacrificial layer is filled in an entirety of each of the grooves. The slicing step is implemented by slicing the sacrificial layer and the light-permeable board along the grooves to form the light-permeable sheets separated from each other, and a plurality of sacrificial rings that are respectively attached onto the light-permeable sheets. Each of the light-permeable sheets has an avoidance slot that is arranged on a peripheral side of the outer surface and that is ring-shaped. The avoidance slot of each of the light-permeable sheets is fully filled with a corresponding one of the sacrificial rings. The placing step is implemented by providing a sensing module including a sensor chip and a ring-shaped supporting layer that is disposed on the sensor chip, and is implemented by placing the inner surface of one of the light-permeable sheets onto the ring-shaped supporting layer. The packaging step is implemented by arranging a liquid compound on a substrate of the sensing module and solidifying the liquid compound to form an encapsulant that includes an adhesive and a plurality of fillers mixed in the adhesive. The sensor chip is mounted on and electrically coupled to the substrate, and the encapsulant is divided into a first segment and a second segment. The first segment is formed on the substrate. The fillers are precipitated in the first segment, and the sensor chip, the ring-shaped supporting layer, and the light-permeable sheet are embedded in the first segment. The second segment is integrally connected to the first segment so as to form a filler settling boundary along a connection interface of the first segment and the second segment. The second segment is connected to a lateral side of the sacrificial sheet, and an inner edge of the filler settling boundary is not in contact with the light-permeable sheet and surrounds the lateral side of the sacrificial sheet. The removing step is implemented by removing the sacrificial ring, whereby the substrate, the sensor chip, the ring-shaped supporting layer, the light-permeable sheet, and the encapsulant are jointly defined as a sensor package structure.

Therefore, the light-permeable sheet provided by the sensor package structure and the manufacturing method of the present disclosure has the avoidance slot corresponding in position to the filler settling boundary, such that a stress concentration part of the encapsulant (e.g., the filler settling boundary) cannot affect or damage on the light-permeable sheet, thereby effectively preventing the light-permeable sheet from cracking.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
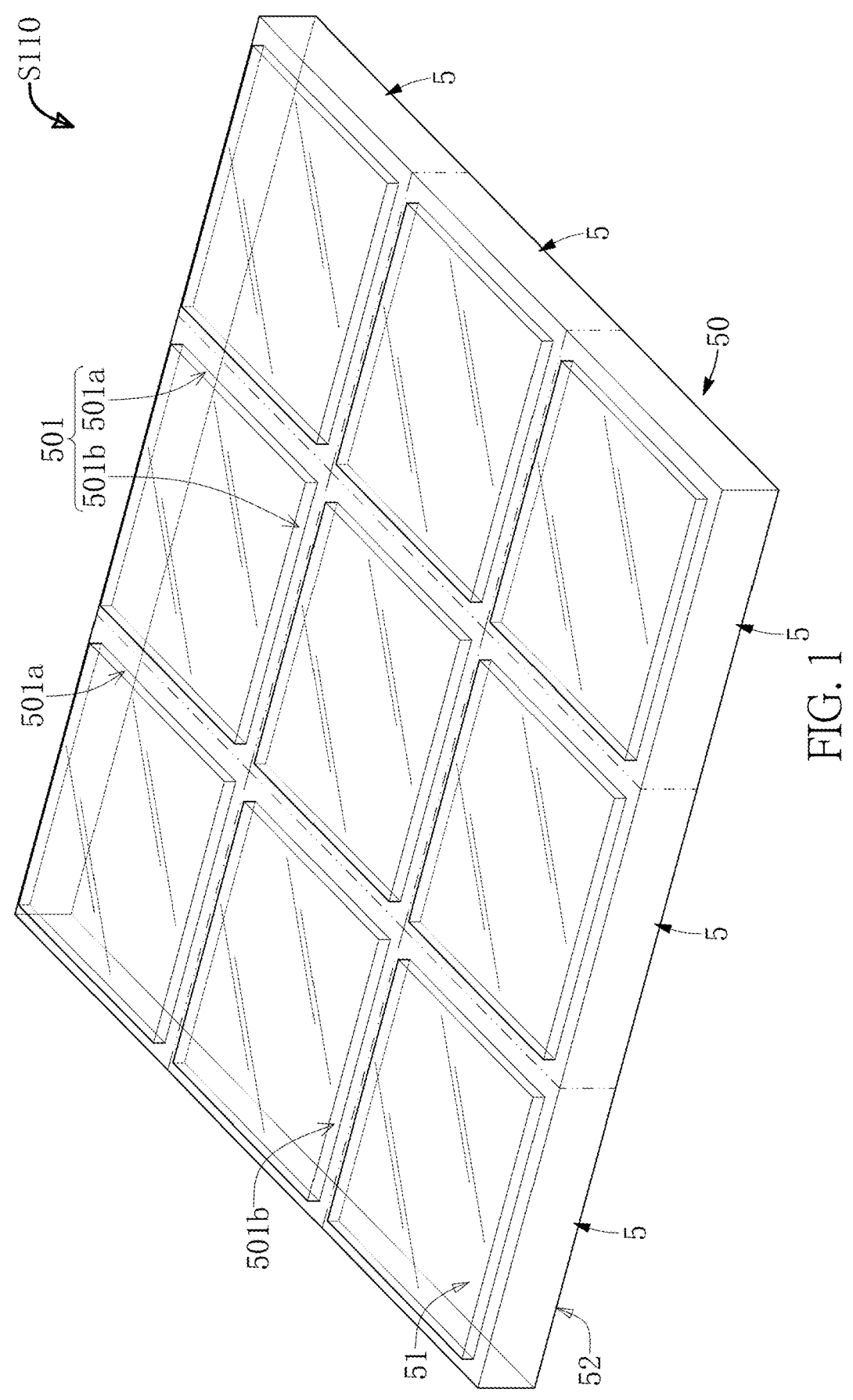
FIG. 1 is a schematic perspective view showing a formation step of a manufacturing method for a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 10, a first embodiment of the present disclosure is provided. The present embodiment provides a sensor package structure 100 and a manufacturing method thereof, and the sensor package structure 100 is preferably manufactured by implementing the manufacturing method, but the present disclosure is not limited thereto. Moreover, in order to clearly understand the present embodiment, the following description firstly describes the manufacturing method, and then describes the sensor package structure 100.

As shown in FIG. 1 to FIG. 6 of the present embodiment, the manufacturing method sequentially includes (or implements): a formation step S110, a filling step S120, a slicing step S130, a placing step S140, a packaging step S150, and a removing step S160. The above steps S110 to S160 are described in the following description and can be adjusted or changed according to practical requirements, and the present disclosure is not limited thereto.

As shown in FIG. 1, the formation step S110 is implemented by recessing an outer surface 51 of a light-permeable board 50 to form a plurality of grooves 501. The light-permeable board 50 has an inner surface 52 opposite to the outer surface 51, and defines a plurality of light-permeable sheets 5 through the grooves 501. In other words, a boundary of each of the light-permeable sheets 5 is defined in the grooves 501.

Specifically, in the formation step S110 of the present embodiment, the light-permeable board 50 is a glass board, and the grooves 50 include a plurality of longitudinal grooves 501a and a plurality of transverse grooves 501b that intersect with the longitudinal grooves 501a. The light-permeable sheets 5 of the light-permeable board 50 are defined to be connected to each other in a matrix arrangement through the longitudinal grooves 501a and the transverse grooves 501b, but the present disclosure is not limited thereto. For example, in other embodiments of the present disclosure not shown in the drawings, the light-permeable sheets 5 can be defined to be spaced apart from each other.

Figure 2:
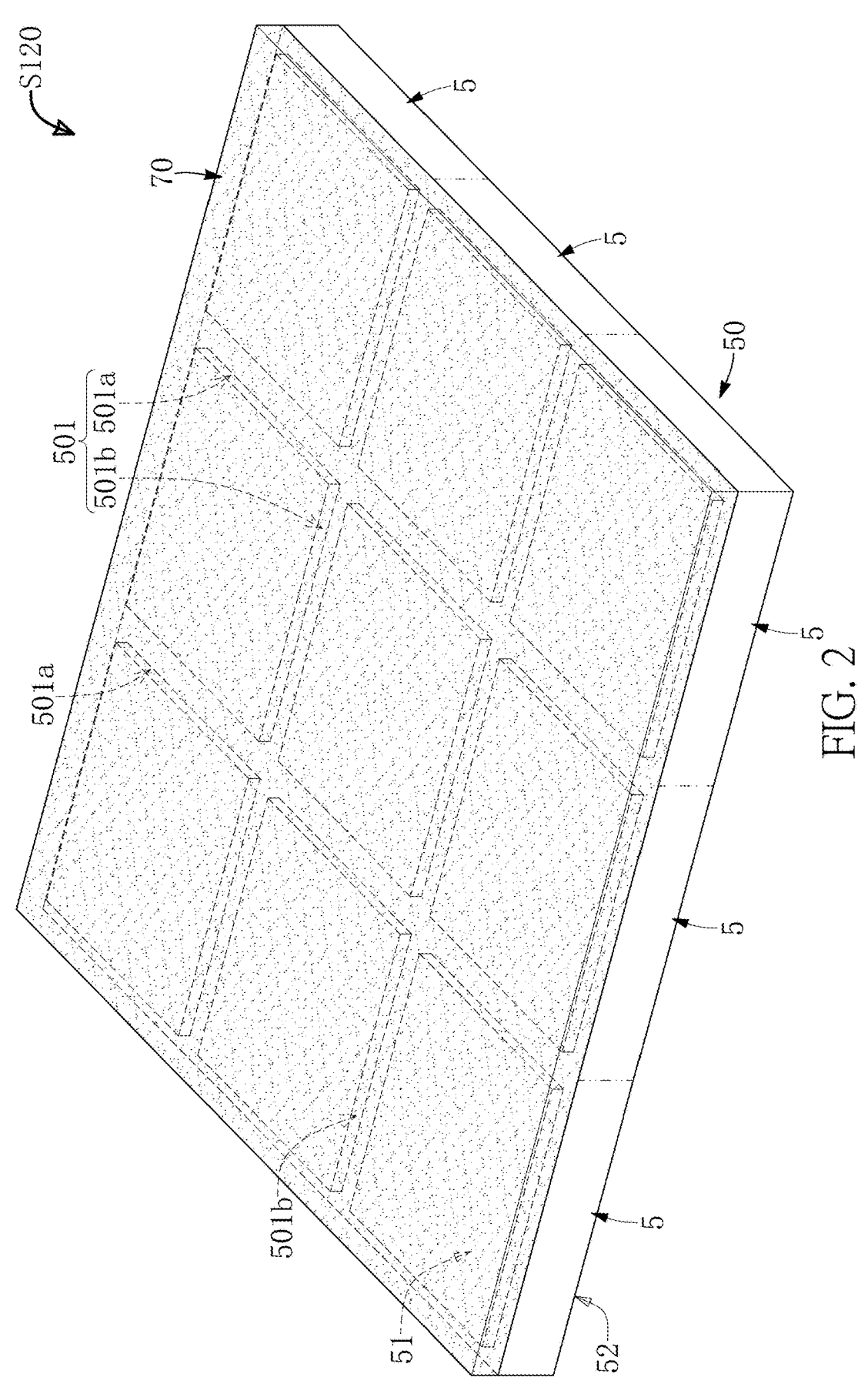
FIG. 2 is a schematic perspective view showing a filling step of the manufacturing method according to the first embodiment of the present disclosure.

As shown in FIG. 2, the filling step S120 is implemented by forming a sacrificial layer 70 on the light-permeable board 50. The sacrificial layer 70 is filled in an entirety of each of the grooves 501 and covers the outer surface 51 of the light-permeable board 50. The sacrificial layer 70 is made of a thermal release adhesive, an ultraviolet (UV) release adhesive, or a hydrolysis release adhesive, but the present disclosure is not limited thereto.

Figure 3:
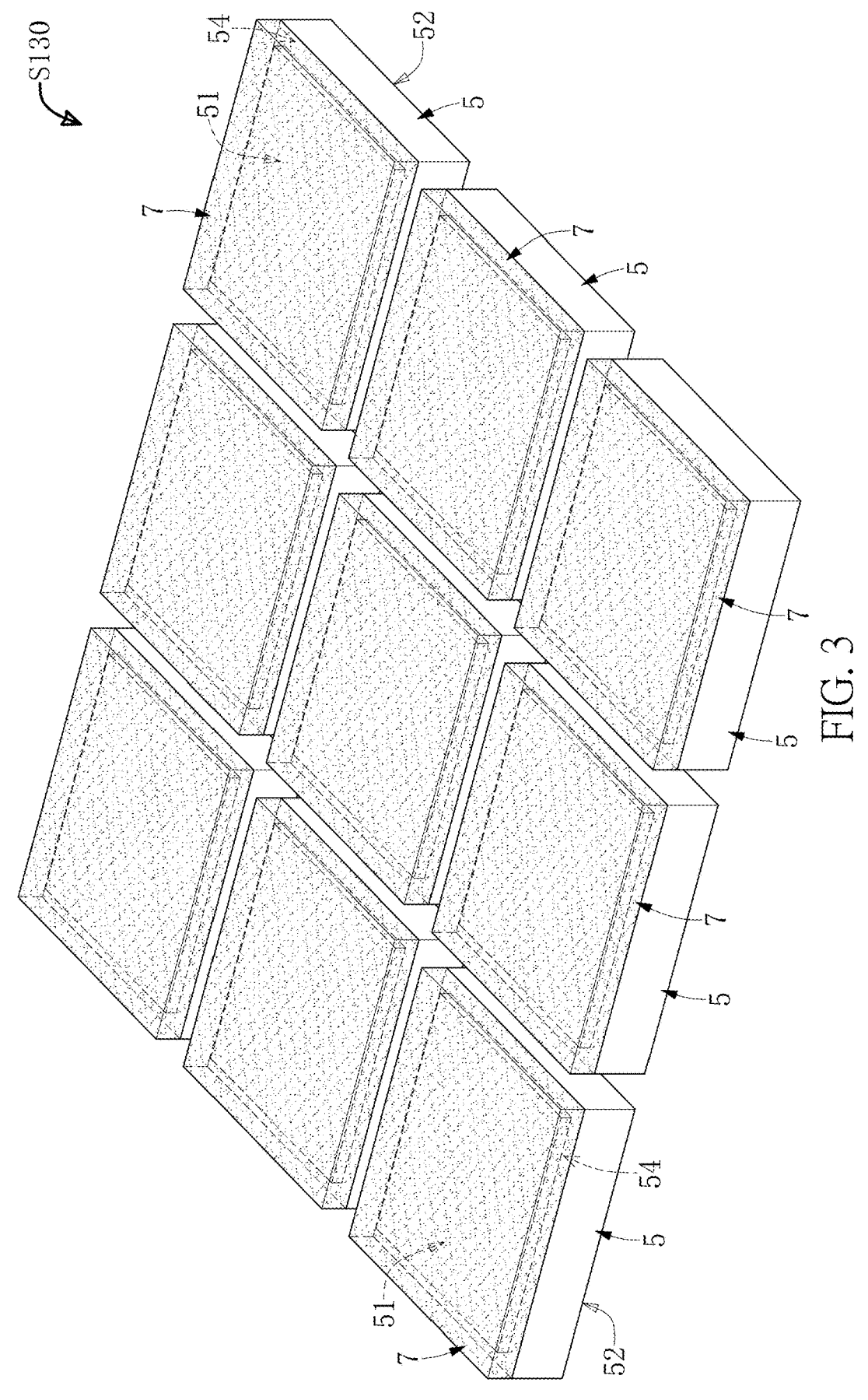
FIG. 3 is a schematic perspective view showing a slicing step of the manufacturing method according to the first embodiment of the present disclosure.

As shown in FIG. 2 and FIG. 3, the slicing step S130 is implemented by slicing the sacrificial layer 70 and the light-permeable board 50 along the grooves 501 to form the light-permeable sheets 5 separated from each other and a plurality of sacrificial sheets 7 that are respectively attached onto the light-permeable sheets 5. In other words, the light-permeable board 50 is sliced into (i.e., divided into) the light-permeable sheets 5, and the sacrificial layer 70 is synchronously sliced into the sacrificial sheets 7.

Moreover, each of the light-permeable sheets 5 has an avoidance slot 54 that is arranged on a peripheral side of the outer surface 51 and that is ring-shaped. The avoidance slot 54 of each of the light-permeable sheets 5 is fully filled with a corresponding one of the sacrificial sheets 7. In other words, each of the grooves 501 is sliced into two half grooves, and the avoidance slot 54 of the light-permeable sheet 5 is formed by four of the half grooves respectively belonging to different four of the grooves 501.

Figure 6:
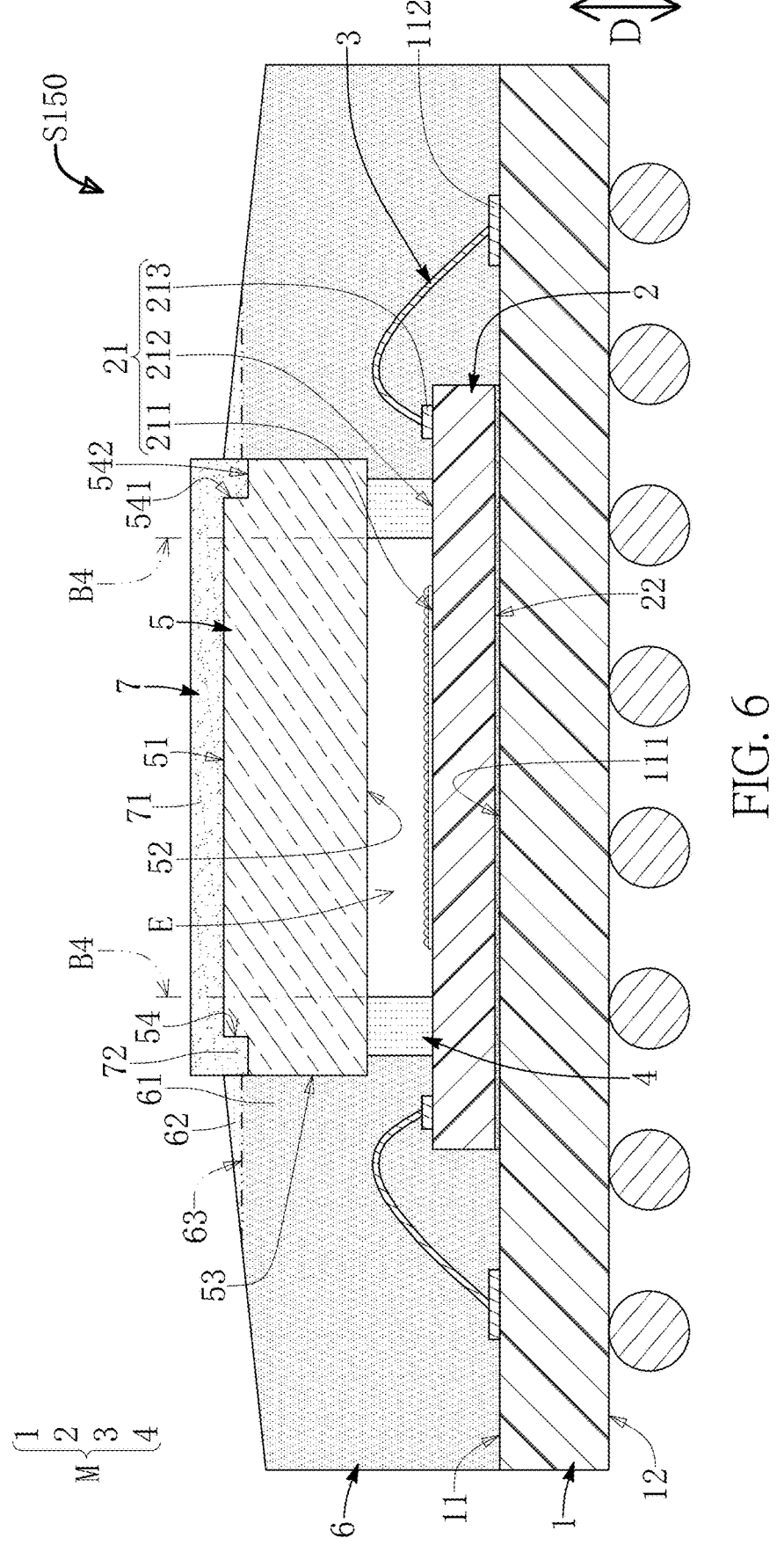
FIG. 6 is a schematic cross-sectional view taken along line VI-VI of FIG. 5.

Specifically, in the slicing step S130 of the present embodiment, each of the sacrificial sheets 7 includes a sheet body 71 and a sacrificial ring 72 that is integrally connected to the sheet body 71 (as shown in FIG. 6). The sheet body 71 covers and is attached on the outer surface 51 of the corresponding light-permeable sheet 5, and the sacrificial ring 72 is filled in an entirety of the corresponding avoidance slot 54.

Figure 4:
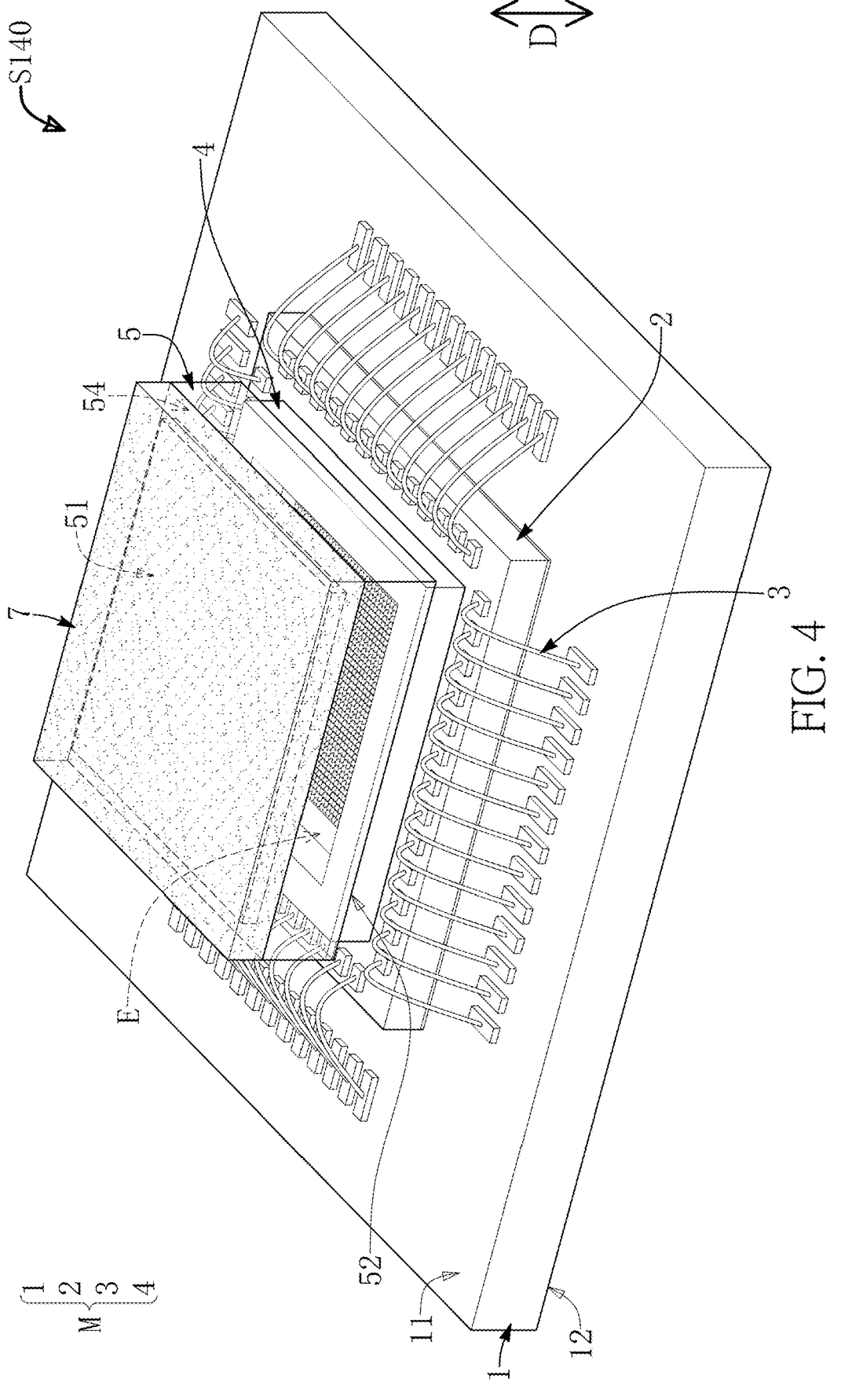
FIG. 4 is a schematic perspective view showing a placing step of the manufacturing method according to the first embodiment of the present disclosure.

As shown in FIG. 4, the placing step S140 is implemented by providing a substrate 1, a sensor chip 2 mounted on and electrically coupled to the substrate 1, and a ring-shaped supporting layer 4 that is disposed on the sensor chip 2, and is implemented by placing the inner surface 52 of one of the light-permeable sheets 5 onto the ring-shaped supporting layer 4. Specifically, the light-permeable sheet 5, the ring-shaped supporting layer 4, and the sensor chip 2 jointly define an enclosed space E that is fully filled with air.

In addition, an electrical connection between the sensor chip 2 and the substrate 1 in the present embodiment is established by a plurality of metal wires 3. The substrate 1, the sensor chip 2, the ring-shaped supporting layer 4, and the metal wires 3 in the present embodiment can be jointly defined as a sensing module M. Assembly of the components of the sensing module M needs to be performed before the implementation of the placing step S140, and a specific time of the assembly is not limited in the present embodiment.

Figure 5:
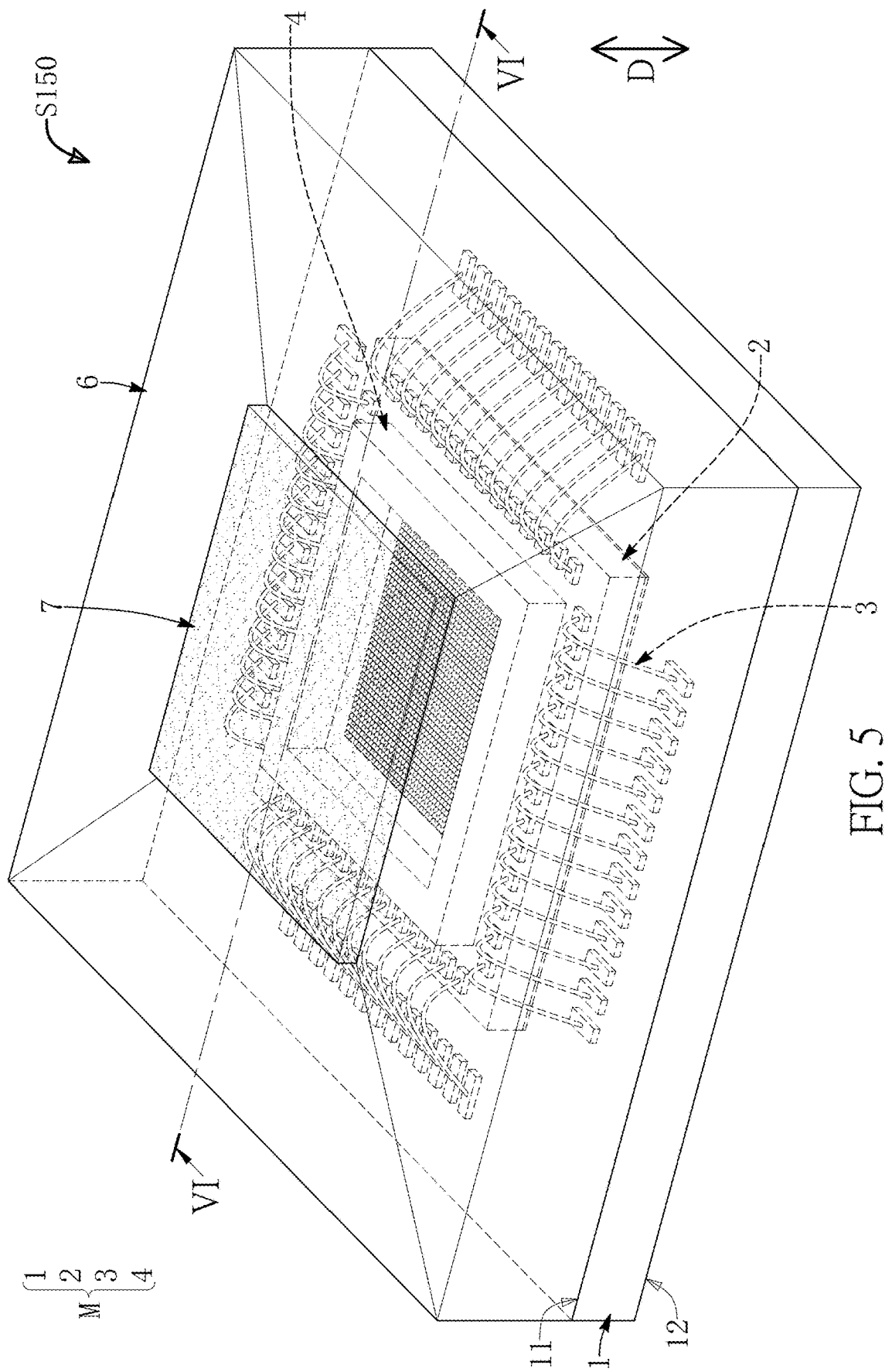
FIG. 5 is a schematic perspective view showing a packaging step of the manufacturing method according to the first embodiment of the present disclosure.

As shown in FIG. 5 and FIG. 6, the packaging step S150 is implemented by arranging a liquid compound on the substrate 1 and solidifying the liquid compound to form an encapsulant 6 that includes an adhesive 6a and a plurality of fillers 6b mixed in the adhesive 6a. In other words, any encapsulant not made of a liquid compound is different from the encapsulant 6 provided by the present embodiment.

Specifically, the encapsulant 6 is divided into (or has) a first segment 61 and a second segment 62 that is integrally connected to the first segment 61. The fillers 6b are precipitated in the first segment 61, and there is almost no filler 6b in the second segment 62, so that the fillers 6b precipitated in the first segment 61 substantially define a filler settling boundary 63 along a connection interface of the first segment 61 and the second segment 62. In other words, the fillers 6b in the first segment 61 has a first density, and the fillers 6b in the second segment 62 has a second density that is less than the first density.

Specifically, the sensor chip 2, the ring-shaped supporting layer 4, the metal wires 3, and the light-permeable sheet 5 are embedded in the first segment 61. In the present embodiment, the first segment 61 is connected to a bottom of a lateral side of the sacrificial sheet 7, and a volume of the first segment 61 is much greater than a volume of the second segment 62 (e.g., the volume of the second segment 62 is within a range from 0.1% to 5% of the volume of the first segment 61).

Moreover, the second segment 62 is connected to the lateral side of the sacrificial sheet 7, and an inner edge of the filler settling boundary 63 is not in contact with a surrounding lateral surface 53 of the light-permeable sheet 5 and surrounds the lateral side of the sacrificial sheet 7. In the present embodiment, the sheet body 71 of the sacrificial sheet 7 protrudes from the encapsulant 6 (e.g., the second segment 62), and the sacrificial ring 72 is embedded in the encapsulant 6, but the present disclosure is not limited thereto.

Figure 7:
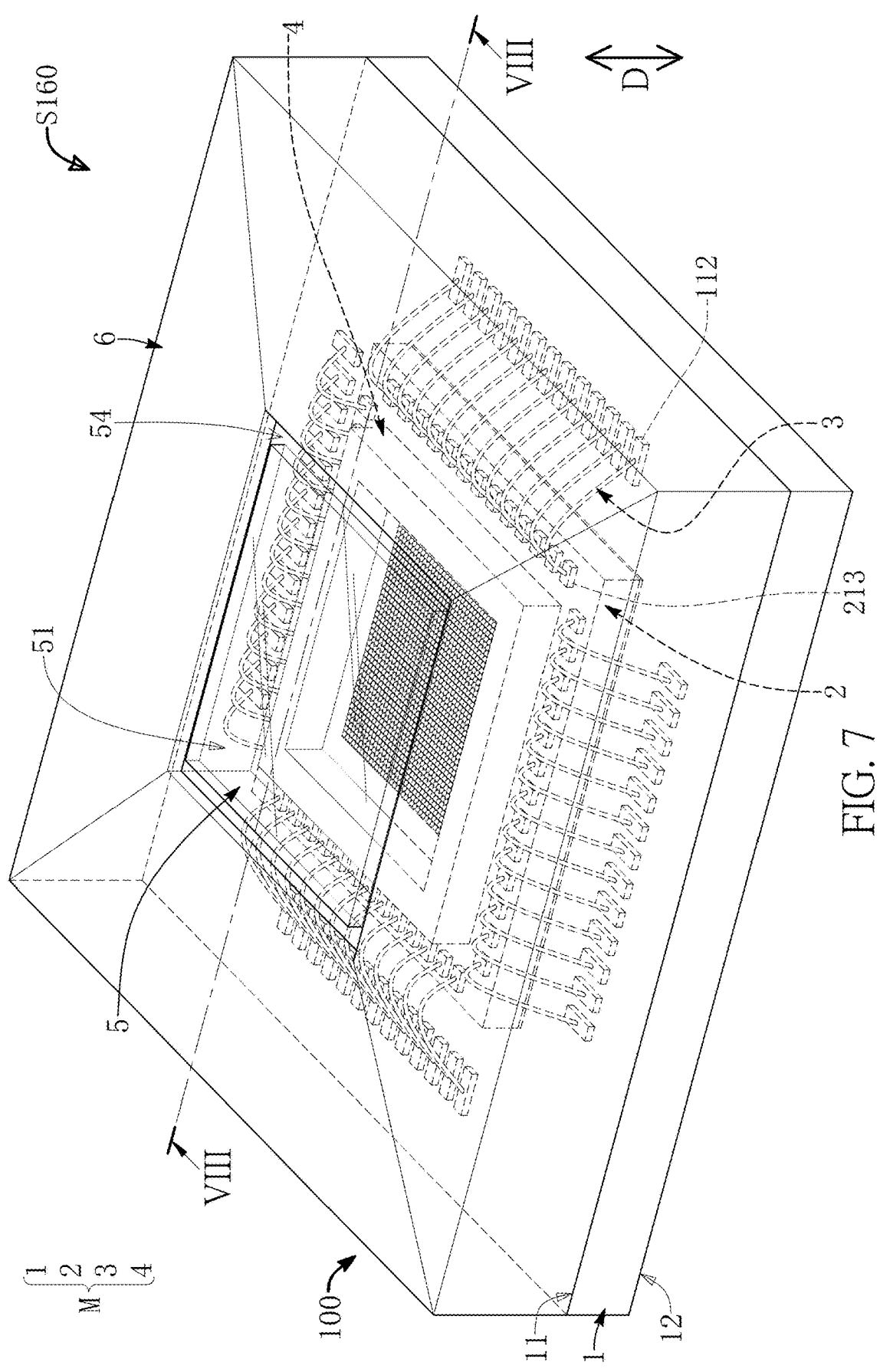
FIG. 7 is a schematic perspective view showing a removing step of the manufacturing method according to the first embodiment of the present disclosure.
Figure 8:
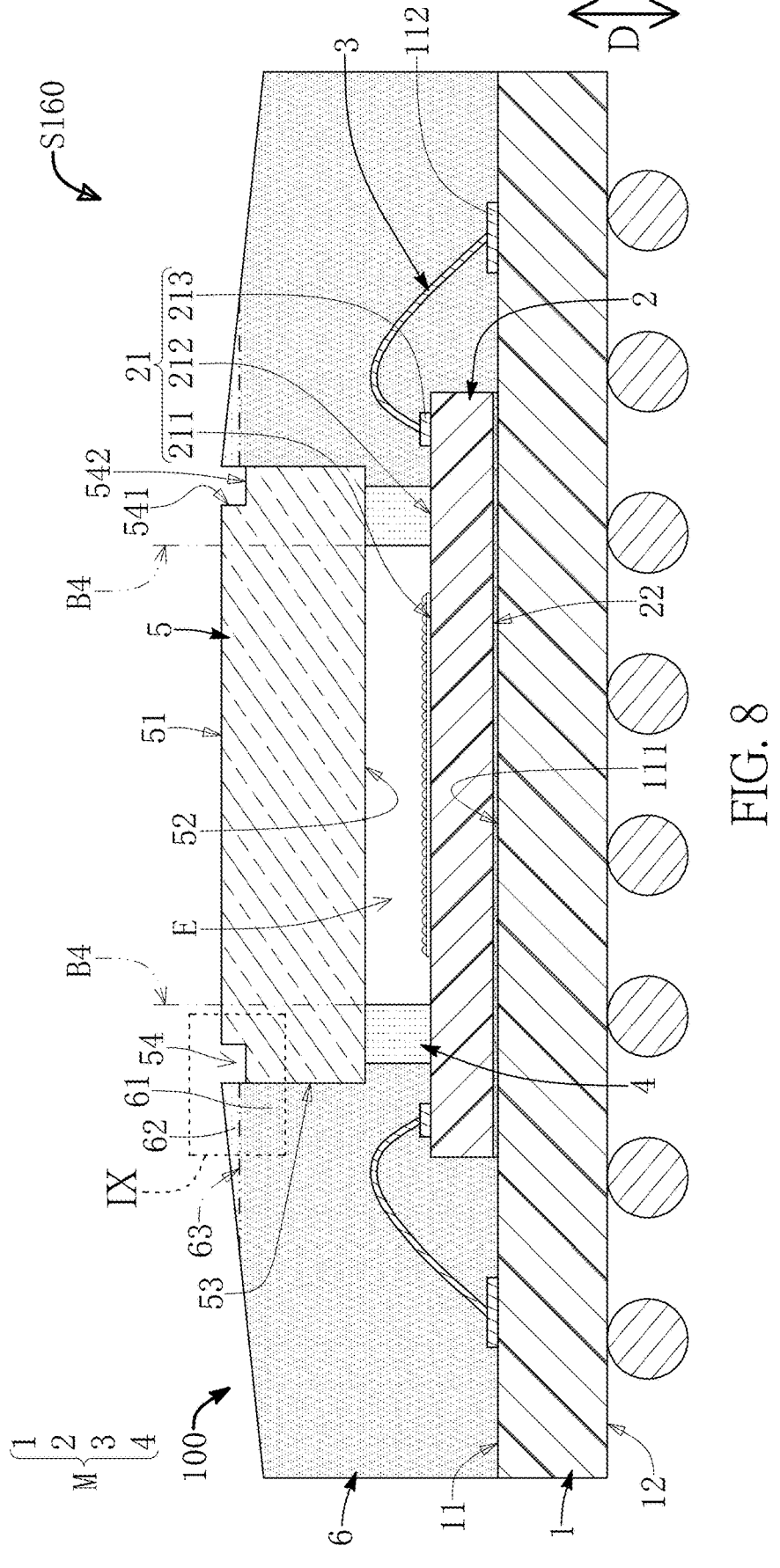
FIG. 8 is a schematic cross-sectional view taken along line VIII-VIII of FIG. 7.
Figure 9:
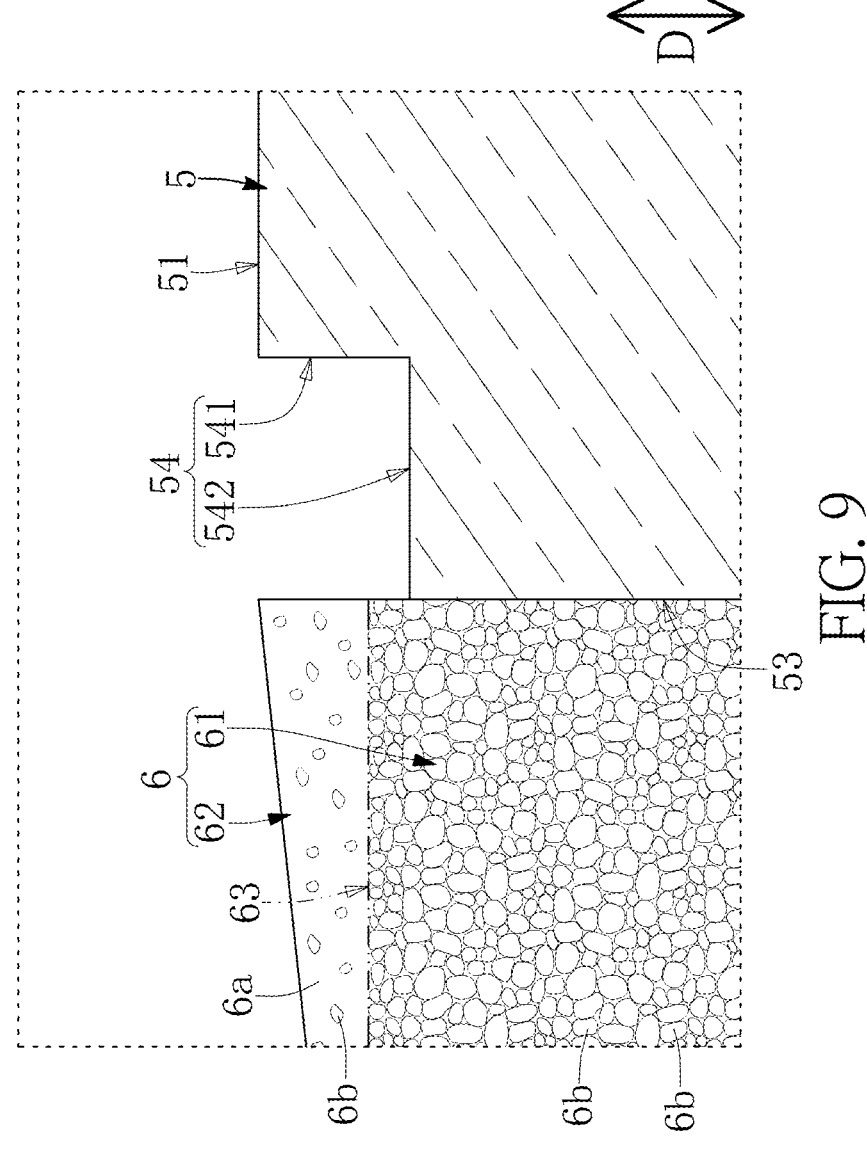
FIG. 9 is a schematic enlarged view of part IX of FIG. 8.

As shown in FIG. 7 to FIG. 9, the removing step S160 is implemented by removing the sacrificial sheet 7, whereby the substrate 1, the sensor chip 2, the metal wires 3, the ring-shaped supporting layer 4, the light-permeable sheet 5, and the encapsulant 6 are jointly defined as the sensor package structure 100. The removing manner of the sacrificial sheet 7 can be adjusted or changed according to the material of the sacrificial sheet 7 (e.g., the thermal release adhesive, the UV release adhesive, or the hydrolysis release adhesive), and the present disclosure is not limited thereto.

Accordingly, the implementation of the manufacturing method is described in the above description, and the following description describes the sensor package structure 100 manufactured by implementing the manufacturing method, such that technical features of the sensor package structure 100 can be referred to the above description, but the present disclosure is not limited thereto. For example, in other embodiments of the present disclosure not shown in the drawings, the sensor package structure 100 can be obtained by implementing other methods according to practical requirements.

As shown in FIG. 7 to FIG. 9, the sensor package structure 100 in the present embodiment includes a substrate 1, a sensor chip 2 disposed on the substrate 1, a plurality of metal wires 3 electrically coupled to the sensor chip 2 and the substrate 1, a ring-shaped supporting layer 4 disposed on the sensor chip 2, a light-permeable sheet 5 disposed on the ring-shaped supporting layer 4, and an encapsulant 6 that is formed on the substrate 1, but the present disclosure is not limited thereto.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner or an adhering manner. The structure and connection relationship of each component of the sensor package structure 100 are recited in the following description.

The substrate 1 of the present embodiment has a square shape or a rectangular shape, but the present disclosure is not limited thereto. The substrate 1 has an upper surface 11 and a lower surface 12 that is opposite to the upper surface 11. The upper surface 11 of the substrate 1 includes a chip-bonding region 111 arranged approximately on a center portion thereof, and the substrate 1 includes a plurality of bonding pads 112 that are disposed on the upper surface 11 and are arranged outside of the chip-bonding region 111. The bonding pads 112 in the present embodiment are in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

The sensor chip 2 in the present embodiment has a square shape or a rectangular shape, and is an image sensor chip, but the present disclosure is not limited thereto. A bottom surface 22 of the sensor chip 2 is fixed onto the chip-bonding region 111 of the substrate 1 (through a chip-bonding adhesive). In other words, the sensor chip 2 is arranged to be surrounded on the inside of the bonding pads 112. Moreover, a top surface 21 of the sensor chip 2 has a sensing region 211 and a carrying region 212 that has a ring shape arranged around the sensing region 211. Two ends of each of the metal wires 3 are respectively connected to the substrate 1 and the carrying region 212 of the sensor chip 2, so that the substrate 1 and the sensor chip 2 are electrically coupled to each other.

Specifically, the sensor chip 2 includes a plurality of connection pads 213 arranged outside of the carrying region 212. In other words, the connection pads 213 are arranged outside of the sensing region 211. The number and positions of the connection pads 213 of the sensor chip 2 in the present embodiment correspond to those of the bonding pads 112 of the substrate 1. In other words, the connection pads 213 in the present embodiment are substantially in a ring-shaped arrangement. Moreover, the two ends of each of the metal wires 3 are respectively connected to one of the bonding pads 112 and the corresponding connection pad 213.

Figure 10:
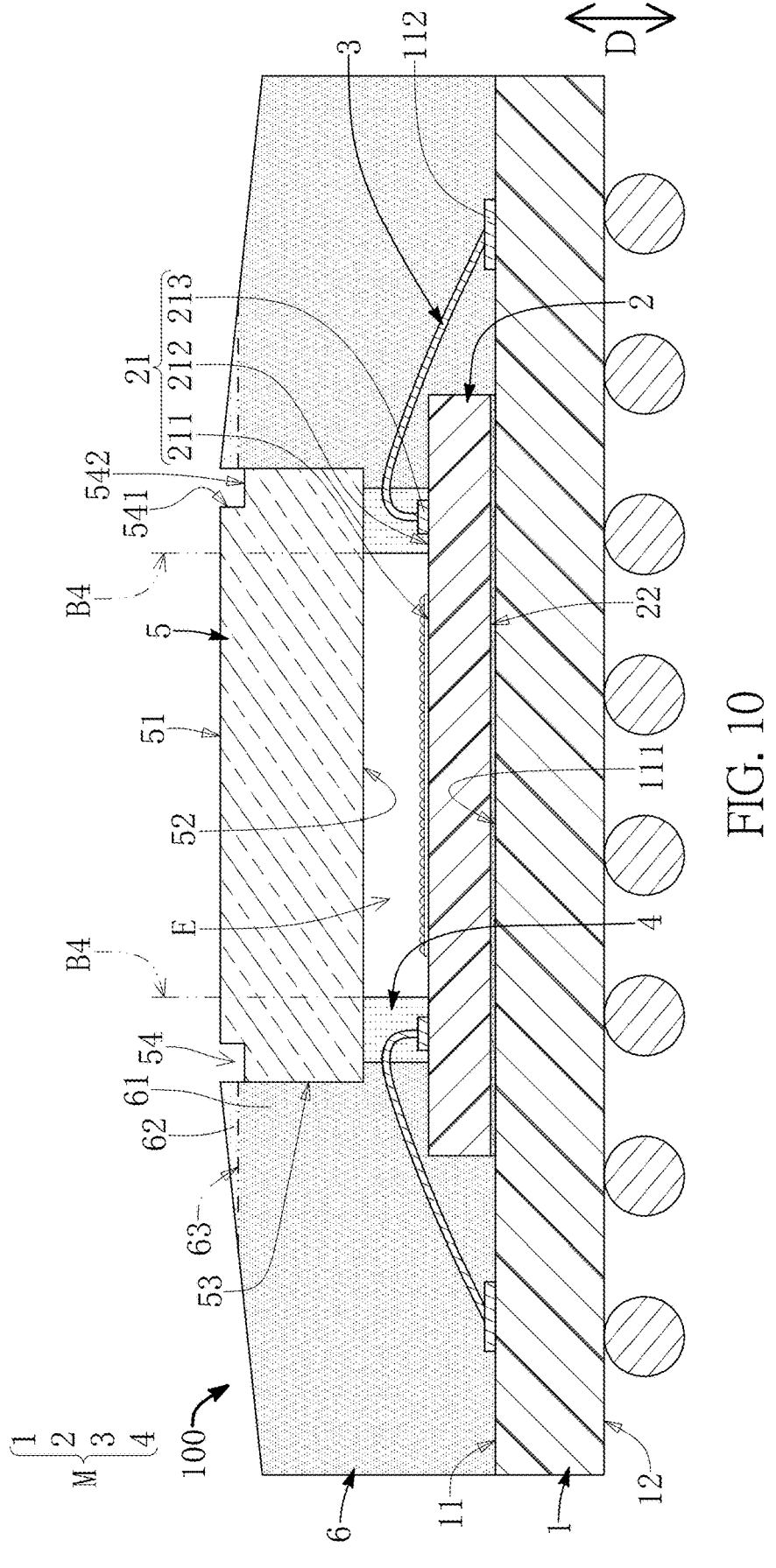
FIG. 10 is a schematic cross-sectional view showing the sensor package structure in another configuration according to the first embodiment of the present disclosure.

The ring-shaped supporting layer 4 is disposed on the carrying region 212 of the sensor chip 2 and surrounds the sensing region 211. In the present embodiment, the ring-shaped supporting layer 4 is arranged inside of the metal wires 3 and is not in contact with any one of the metal wires 3 (i.e., each of the metal wires 3 is arranged outside of the ring-shaped supporting layer 4 and is entirely embedded in the encapsulant 6), but the present disclosure is not limited thereto. For example, as shown in FIG. 10, a part of each of the metal wires 3 is embedded in the ring-shaped supporting layer 4, and a remaining part of each of the metal wires 3 is embedded in the encapsulant 6.

The light-permeable sheet 5 in the present embodiment is a transparent and flat glass board, but the present disclosure is not limited thereto. The light-permeable sheet 5 has an outer surface 51, an inner surface 52 opposite to the outer surface 51, a surrounding lateral surface 53 arranged between the inner surface 52 and the outer surface 51, and an avoidance slot 54 that is ring-shaped and that is connected to the outer surface 51 and the surrounding lateral surface 53. The light-permeable sheet 5 is disposed on the ring-shaped supporting layer 4 along a predetermined direction D through the inner surface 52, and the light-permeable sheet 5, the ring-shaped supporting layer 4, and the top surface 21 of the sensor chip 2 jointly define an enclosed space E.

Specifically, the avoidance slot 54 in the present embodiment is fully filled with air, and the avoidance slot 54 has a tread surface 541 connected to the surrounding lateral surface 53 and a riser surface 542 that is connected in-between the outer surface 51 and the tread surface 541. The avoidance slot 54 is preferably provided (or formed) as follows. The riser surface 542 is arranged in a projection space defined by orthogonally projecting the ring-shaped supporting layer 4 toward the outer surface 51 of the light-permeable sheet 5 along the predetermined direction D. In other words, the avoidance slot 54 is arranged at an outer side of a projection boundary B4 defined by orthogonally projecting an inner edge of the ring-shaped supporting layer 4 toward the outer surface 51 of the light-permeable sheet 5 along the predetermined direction D.

The encapsulant 6 is a solidified liquid compound and is not arranged in the avoidance slot 54. The encapsulant 6 includes an adhesive 6a and a plurality of fillers 6b mixed in the adhesive 6a. In other words, any encapsulant not made of a liquid compound is different from the encapsulant 6 provided by the present embodiment.

Specifically, the encapsulant 6 is divided into (or has) a first segment 61 formed on the substrate 1 and a second segment 62 that is integrally connected to the first segment 61. The fillers 6b are precipitated in the first segment 61, and there is almost no filler 6b in the second segment 62, so that the fillers 6b precipitated in the first segment 61 substantially define a filler settling boundary 63 along a connection interface of the first segment 61 and the second segment 62. In other words, the fillers 6b in the first segment 61 has a first density, and the fillers 6b in the second segment 62 has a second density that is less than the first density.

Specifically, the sensor chip 2, the ring-shaped supporting layer 4, at least part of each of the metal wires 3, and the light-permeable sheet 5 are embedded in the first segment 61. In the present embodiment, the surrounding lateral surface 53 of the light-permeable sheet 5 is entirely connected to the first segment 61.

Moreover, a volume of the first segment 61 is much greater than a volume of the second segment 62 (e.g., the volume of the second segment 62 is within a range from 0.1% to 5% of the volume of the first segment 61). Moreover, the second segment 62 is not in contact with the light-permeable sheet 5, and an inner edge of the filler settling boundary 63 is not in contact with the surrounding lateral surface 53 of the light-permeable sheet 5 and surrounds at an outer side of the avoidance slot 54.

Specifically, along the predetermined direction D, the filler settling boundary 63 is higher than the tread surface 541 with respect to the substrate 1 by a distance that is preferably less than or equal to 100 μm, and a top edge of the second segment 62 is spaced apart from the outer surface 51 of the light-permeable sheet 5 by a height difference that is less than or equal to 10 μm (e.g., the height difference being 0, and the top edge of the second segment 62 being coplanar with the outer surface 51 of the light-permeable sheet 5). In addition, a projection region defined by orthogonally projecting the filler settling boundary 63 onto the avoidance slot 54 along a direction perpendicular to the predetermined direction D is located on the riser surface 542.

In summary, the light-permeable sheet 5 provided by the sensor package structure 100 and the manufacturing method of the present embodiment has the avoidance slot 54 corresponding in position to the filler settling boundary 63, such that a stress concentration part of the encapsulant 6 (e.g., the filler settling boundary 63) cannot affect or damage on the light-permeable sheet 5, thereby effectively preventing the light-permeable sheet 5 from cracking.

Second Embodiment

Referring to FIG. 11 to FIG. 14, a second embodiment of the present disclosure, which is similar to the first embodiment of the present disclosure, is provided. For the sake of brevity, descriptions of same components in the first and second embodiments of the present disclosure will be omitted herein, and the following description only discloses different features between the first and second embodiments.

Figure 11:
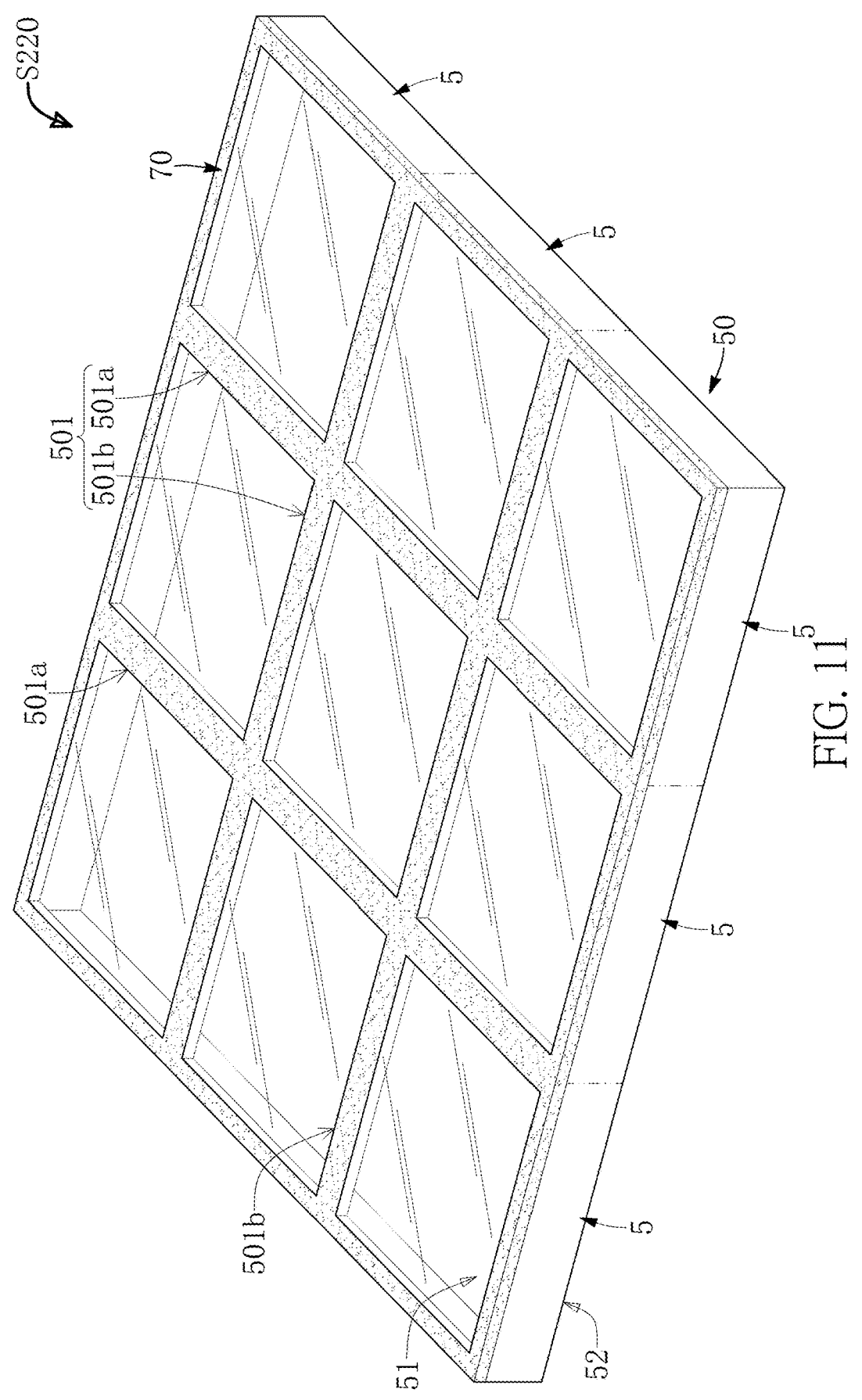
FIG. 11 is a schematic perspective view showing the filling step of the manufacturing method according to a second embodiment of the present disclosure.

As shown in FIG. 11, the filling step S220 is implemented by forming a sacrificial layer 70 on the light-permeable board 50. The sacrificial layer 70 is filled in an entirety of each of the grooves 501. In other words, the sacrificial layer 70 of the present embodiment does not cover the outer surface 51 of the light-permeable board 50.

Figure 12:
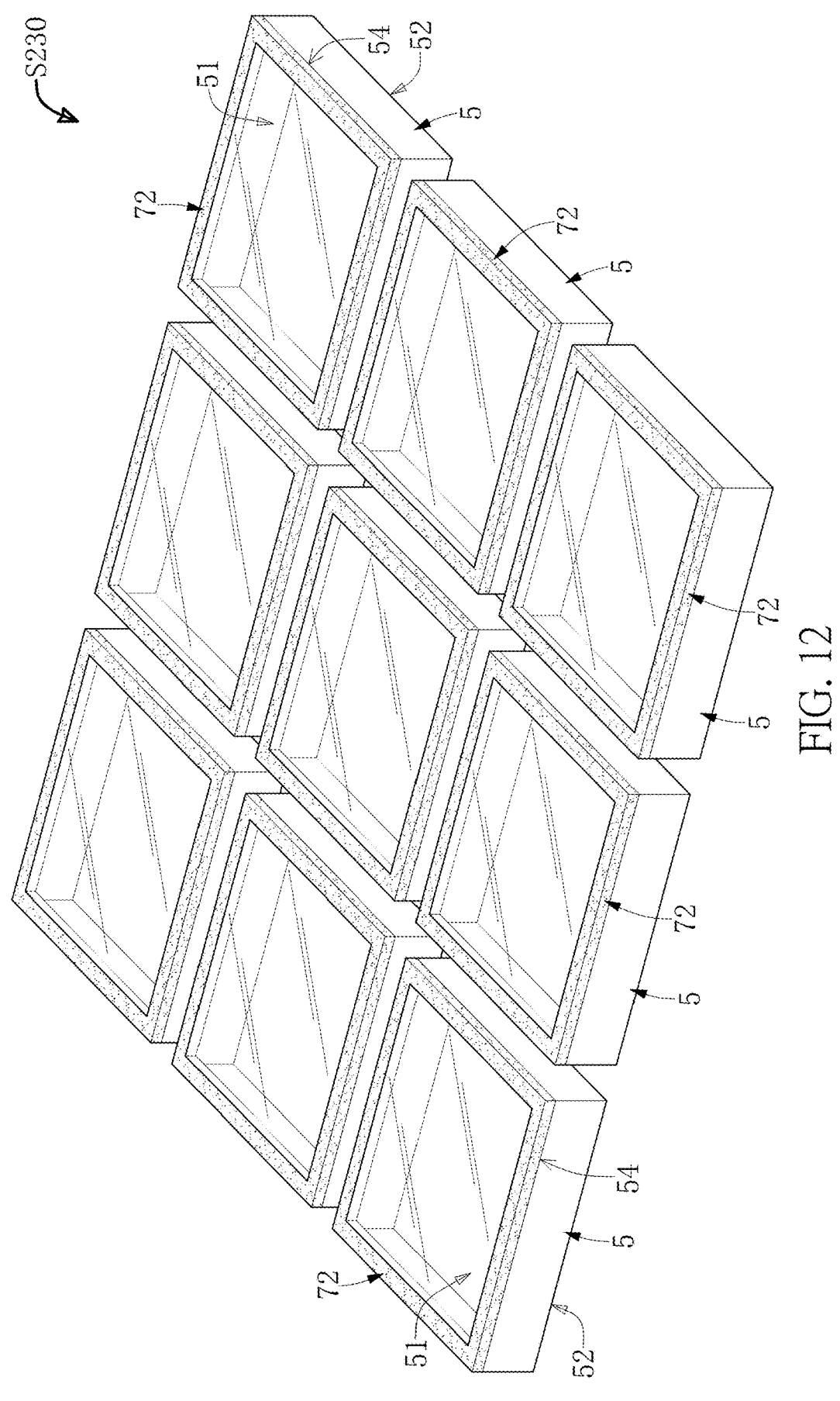
FIG. 12 is a schematic perspective view showing the slicing step of the manufacturing method according to the second embodiment of the present disclosure.

As shown in FIG. 11 and FIG. 12, the slicing step S230 is implemented by slicing the sacrificial layer 70 and the light-permeable board 50 along the grooves 501 to form the light-permeable sheets 5 separated from each other and a plurality of sacrificial rings 72 that are respectively attached onto the light-permeable sheets 5. Each of the light-permeable sheets 5 has an avoidance slot 54 that is arranged on a peripheral side of the outer surface 51 and that is ring-shaped. The avoidance slot 54 of each of the light-permeable sheets 5 is fully filled with a corresponding one of the sacrificial rings 72.

Figure 13:
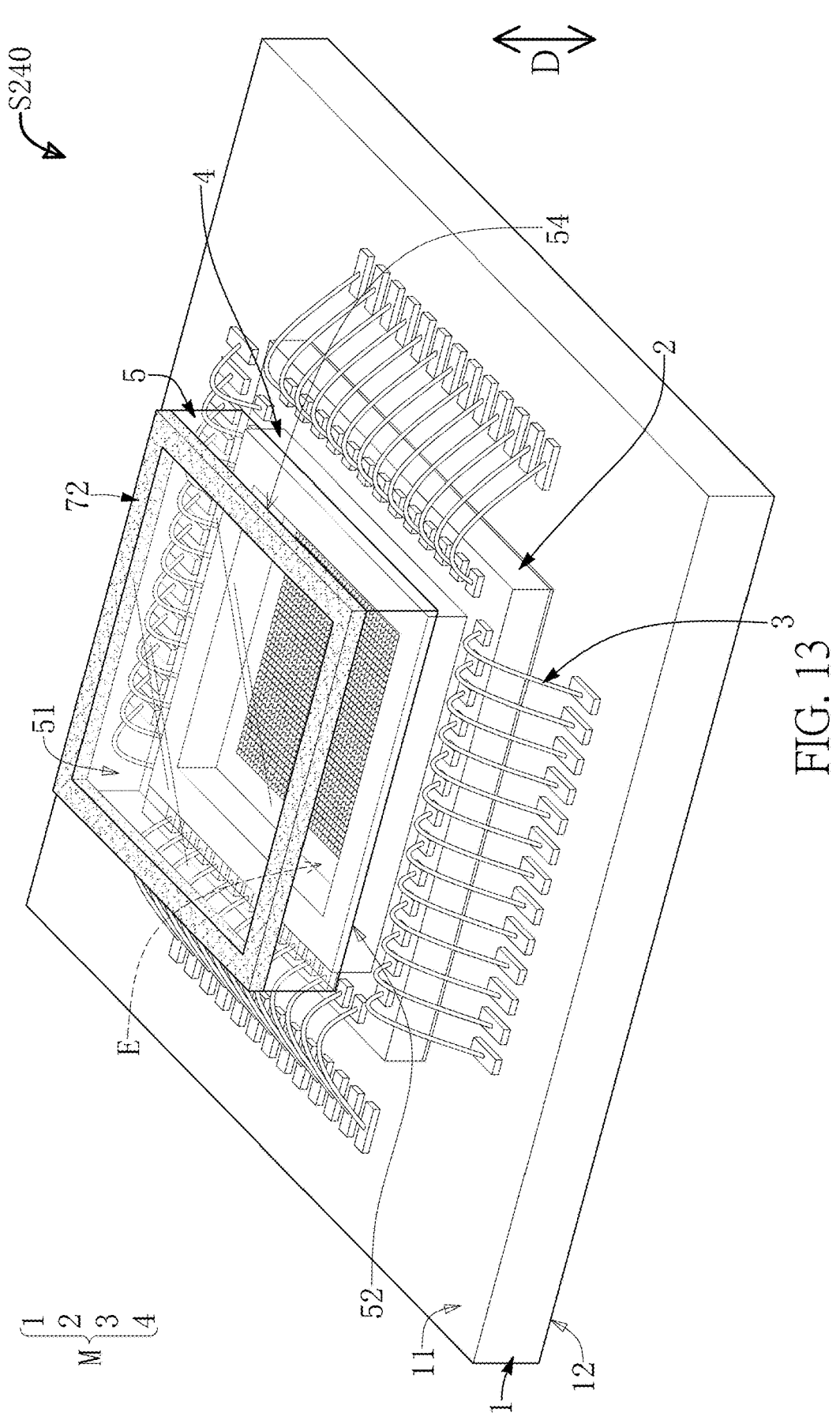
FIG. 13 is a schematic perspective view showing the placing step of the manufacturing method according to the second embodiment of the present disclosure.

As shown in FIG. 13, the placing step S240 is implemented by providing a sensing module M including a sensor chip 2 and a ring-shaped supporting layer 4 that is disposed on the sensor chip 2, and is implemented by placing the inner surface 52 of one of the light-permeable sheets 5 onto the ring-shaped supporting layer 4.

Figure 14:
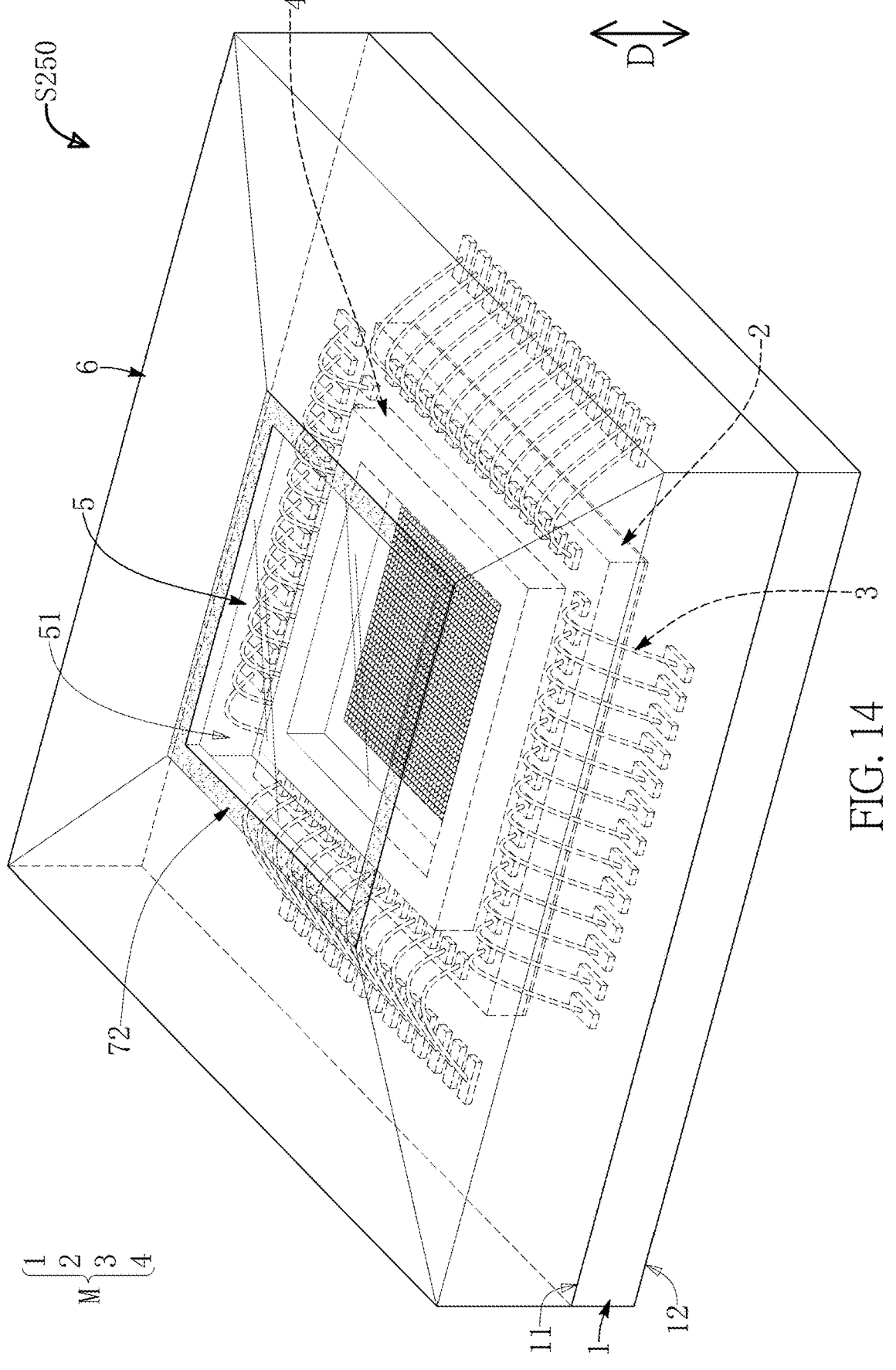
FIG. 14 is a schematic perspective view showing the packaging step of the manufacturing method according to the second embodiment of the present disclosure.

As shown in FIG. 14, the packaging step S250 is implemented by arranging a liquid compound on a substrate 1 of the sensing module M and solidifying the liquid compound to form an encapsulant 6. The sensor chip 2 is mounted on and electrically coupled to the substrate 1, and the encapsulant 6 of the present embodiment is substantially identical to the encapsulant 6 provided by the first embodiment.

In summary, according to the placing step S240 and the packaging step S250 of the present embodiment, the sensor chip 2 can be mounted on the substrate 1 after the light-permeable sheet 5 is disposed on the ring-shaped supporting layer 4. The connection manner between the sensor chip 2 and the substrate 1 can be established by a plurality of metal wires 3, and the present disclosure is not limited thereto.

Third Embodiment

Figure 15:
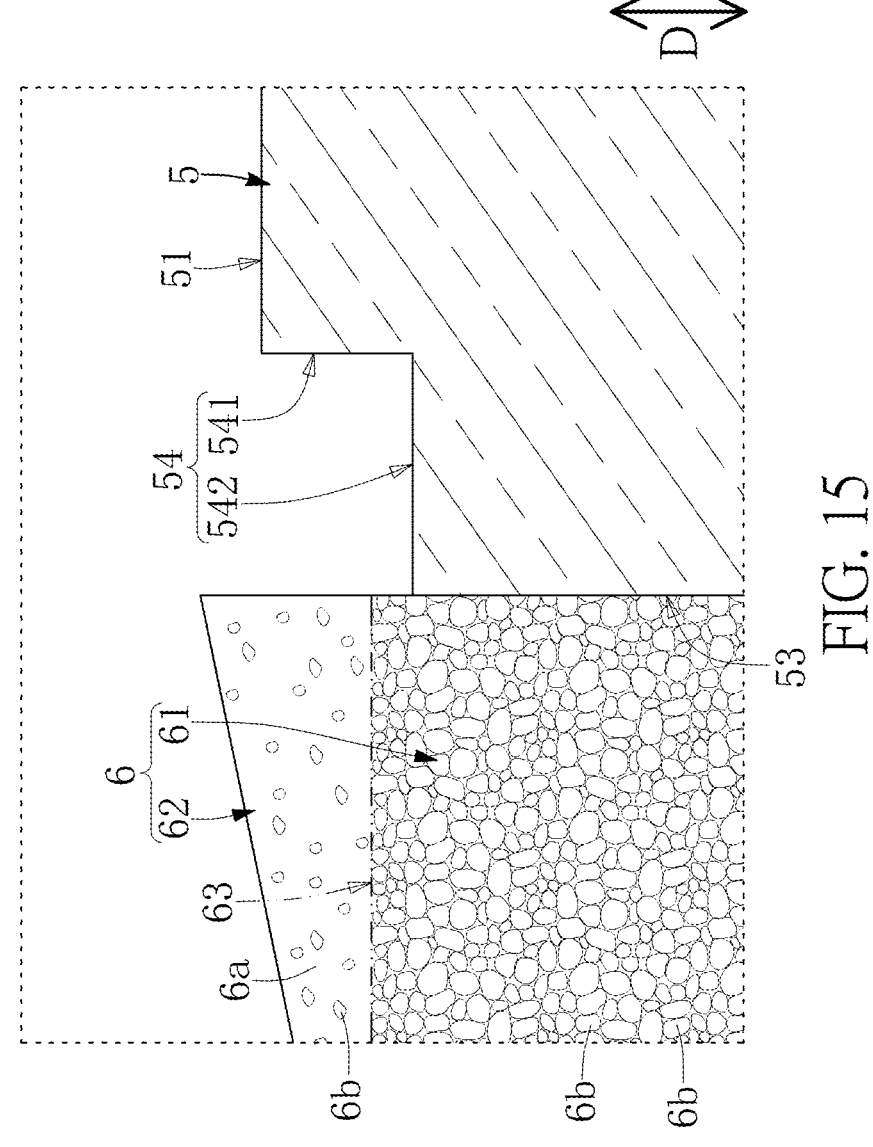
FIG. 15 is a schematic enlarged view showing a part of the sensor package structure according to a third embodiment of the present disclosure.
Figure 16:
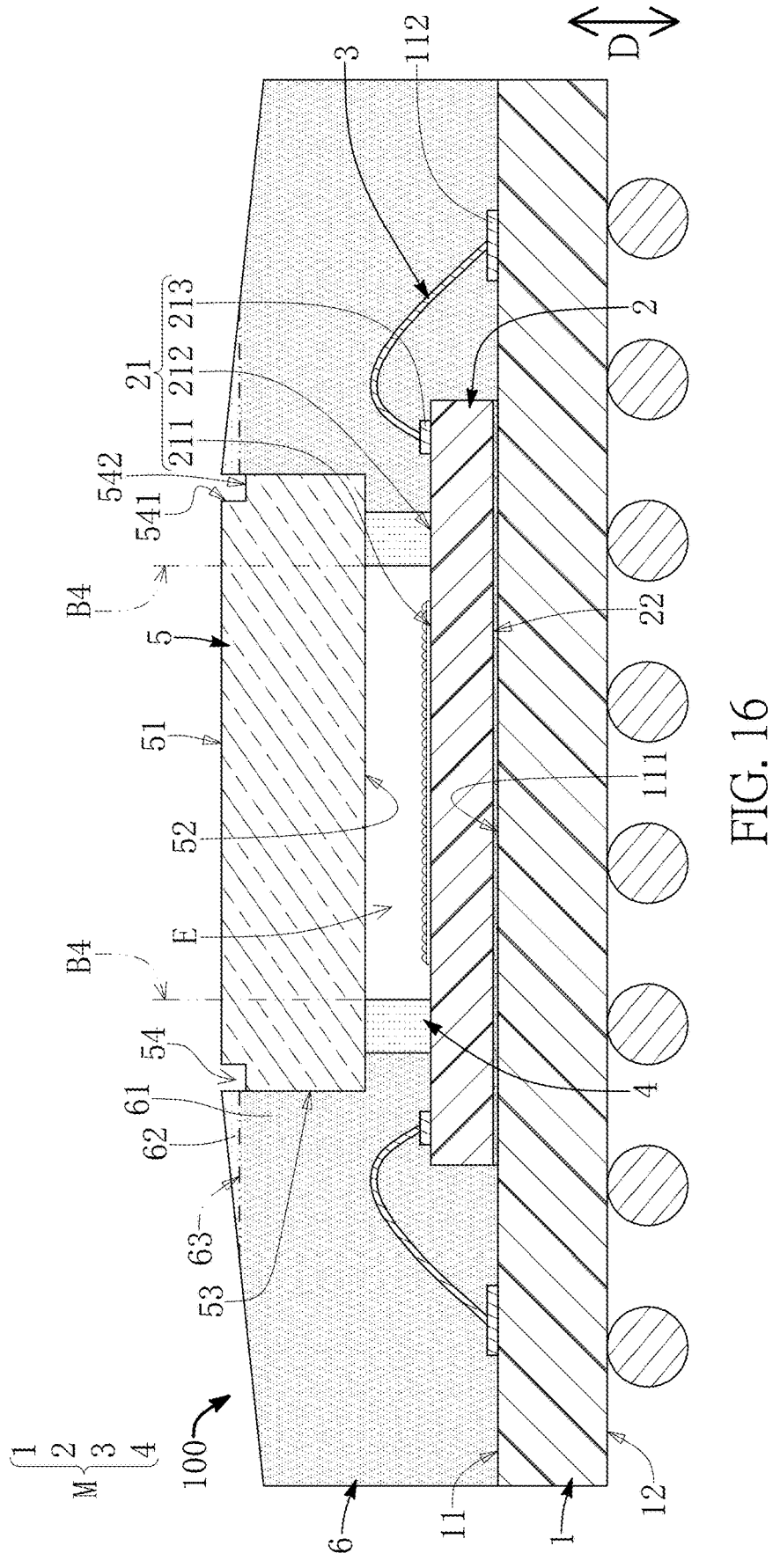
FIG. 16 is a schematic cross-sectional view showing the sensor package structure in another configuration according to the third embodiment of the present disclosure.

Referring to FIG. 15 and FIG. 16, a third embodiment of the present disclosure, which is similar to the first embodiment of the present disclosure, is provided. For the sake of brevity, descriptions of same components in the first and third embodiments of the present disclosure will be omitted herein, and the following description only discloses different features between the first and third embodiments.

In the present embodiment, the sensor package structure 100 can be adjusted according to practical requirements. For example, as shown in FIG. 15, along the predetermined direction D, the top edge of the second segment 62 is higher than the outer surface 51 of the light-permeable sheet 5 with respect to the substrate 1, such that the filler settling boundary 63 can be raised with respect to the avoidance slot 54, thereby increasing the structural strength of the light-permeable sheet 5.

Or, as shown in FIG. 16, the riser surface 542 is arranged at an outer side of a projection space defined by orthogonally projecting the ring-shaped supporting layer 4 toward the outer surface 51 of the light-permeable sheet 5 along the predetermined direction D. Accordingly, a width of the avoidance slot 54 can be reduced for increasing the structural strength of the light-permeable sheet 5.

Beneficial Effects of the Embodiments

In conclusion, the light-permeable sheet provided by the sensor package structure and the manufacturing method of the present disclosure has the avoidance slot corresponding in position to the filler settling boundary, such that a stress concentration part of the encapsulant (e.g., the filler settling boundary) cannot affect or damage on the light-permeable sheet, thereby effectively preventing the light-permeable sheet from cracking.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of a sensor package structure, comprising:

a formation step implemented by recessing an outer surface of a light-permeable board to form a plurality of grooves, wherein the light-permeable board has an inner surface opposite to the outer surface, and defines a plurality of light-permeable sheets through the grooves;

a filling step implemented by forming a sacrificial layer on the light-permeable board, wherein the sacrificial layer is filled in an entirety of each of the grooves and covers the outer surface;

a slicing step implemented by slicing the sacrificial layer and the light-permeable board along the grooves to form the light-permeable sheets separated from each other and a plurality of sacrificial sheets that are respectively attached onto the light-permeable sheets, wherein each of the light-permeable sheets has an avoidance slot that is arranged on a peripheral side of the outer surface and that is ring-shaped, and wherein the avoidance slot of each of the light-permeable sheets is fully filled with a corresponding one of the sacrificial sheets;

a placing step implemented by providing a substrate, a sensor chip mounted on and electrically coupled to the substrate, and a ring-shaped supporting layer that is disposed on the sensor chip, and by placing the inner surface of one of the light-permeable sheets onto the ring-shaped supporting layer;

a packaging step implemented by arranging a liquid compound on the substrate and solidifying the liquid compound to form an encapsulant that includes an adhesive and a plurality of fillers mixed in the adhesive, wherein the encapsulant is divided into:

a first segment formed on the substrate, wherein the fillers are precipitated in the first segment, and the sensor chip, the ring-shaped supporting layer, and the light-permeable sheet are embedded in the first segment; and a second segment that is integrally connected to the first segment so as to form a filler settling boundary along a connection interface of the first segment and the second segment, wherein the second segment is connected to a lateral side of the sacrificial sheet, and an inner edge of the filler settling boundary is not in contact with the light-permeable sheet and surrounds the lateral side of the sacrificial sheet; and a removing step implemented by removing the sacrificial sheet, whereby the substrate, the sensor chip, the ring-shaped supporting layer, the light-permeable sheet, and the encapsulant are jointly defined as a sensor package structure.

2. The manufacturing method according to claim 1, wherein, in the formation step, the grooves include a plurality of longitudinal grooves and a plurality of transverse grooves that intersect with the longitudinal grooves, and the light-permeable sheets of the light-permeable board are defined to be connected to each other in a matrix arrangement through the longitudinal grooves and the transverse grooves.

3. The manufacturing method according to claim 1, wherein, in the filling step, the sacrificial layer is made of a thermal release adhesive, an ultraviolet (UV) release adhesive, or a hydrolysis release adhesive.

4. The manufacturing method according to claim 1, wherein, in the slicing step, each of the sacrificial sheets includes:

a sheet body covering and attached on the outer surface of the corresponding light-permeable sheet; and a sacrificial ring integrally connected to the sheet body and filled in an entirety of the corresponding avoidance slot.

5. The manufacturing method according to claim 4, wherein, in the packaging step, the sheet body of the sacrificial sheet protrudes from the encapsulant, and the sacrificial ring is embedded in the encapsulant.

6. The manufacturing method according to claim 1, wherein, in the packaging step, a volume of the second segment is within a range from 0.1% to 5% of a volume of the first segment.

7. A sensor package structure, comprising:

a substrate;

a sensor chip disposed on and electrically coupled to the substrate, wherein a top surface of the sensor chip has a sensing region and a carrying region that surrounds the sensing region;

a ring-shaped supporting layer disposed on the carrying region of the sensor chip and surrounding the sensing region;

a light-permeable sheet having an outer surface, an inner surface opposite to the outer surface, a surrounding lateral surface arranged between the inner surface and the outer surface, and an avoidance slot that is ring-shaped and that is connected to the outer surface and the surrounding lateral surface, wherein the light-permeable sheet is disposed on the ring-shaped supporting layer along a predetermined direction through the inner surface, and the light-permeable sheet, the ring-shaped supporting layer, and the top surface of the sensor chip jointly define an enclosed space; and an encapsulant that is a solidified liquid compound including an adhesive and a plurality of fillers mixed in the adhesive, wherein the encapsulant is not arranged in the avoidance slot and is divided into:

a first segment formed on the substrate, wherein the fillers are precipitated in the first segment, and wherein the sensor chip, the ring-shaped supporting layer, and the light-permeable sheet are embedded in the first segment, and the surrounding lateral surface of the light-permeable sheet is entirely connected to the first segment; and a second segment that is integrally connected to the first segment so as to form a filler settling boundary along a connection interface of the first segment and the second segment, wherein an inner edge of the filler settling boundary is not in contact with the surrounding lateral surface of the light-permeable sheet and surrounds an outer side of the avoidance slot.

8. The sensor package structure according to claim 7, wherein a volume of the second segment is within a range from 0.1% to 5% of a volume of the first segment.

9. The sensor package structure according to claim 7, wherein the avoidance slot has:

a tread surface connected to the surrounding lateral surface; and a riser surface connected in-between the outer surface and the tread surface, wherein a projection region defined by orthogonally projecting the filler settling boundary onto the avoidance slot along a direction perpendicular to the predetermined direction is located on the riser surface.

10. The sensor package structure according to claim 9, wherein, along the predetermined direction, the filler settling boundary is higher than the tread surface with respect to the substrate by a distance that is less than or equal to 100 μm.

11. The sensor package structure according to claim 9, wherein the riser surface is arranged in a projection space defined by orthogonally projecting the ring-shaped supporting layer toward the outer surface of the light-permeable sheet along the predetermined direction.

12. The sensor package structure according to claim 9, wherein the riser surface is arranged at an outer side of a projection space defined by orthogonally projecting the ring-shaped supporting layer toward the outer surface of the light-permeable sheet along the predetermined direction.

13. The sensor package structure according to claim 7, wherein the avoidance slot is fully filled with air.

14. The sensor package structure according to claim 7, wherein the avoidance slot is arranged at an outer side of a projection boundary defined by orthogonally projecting an inner edge of the ring-shaped supporting layer toward the outer surface of the light-permeable sheet along the predetermined direction.

15. The sensor package structure according to claim 7, wherein, along the predetermined direction, a top edge of the second segment is spaced apart from the outer surface of the light-permeable sheet by a height difference that is less than or equal to 10 μm.

16. The sensor package structure according to claim 15, wherein the top edge of the second segment is coplanar with the outer surface of the light-permeable sheet.

17. The sensor package structure according to claim 15, wherein, along the predetermined direction, the top edge of the second segment is higher than the outer surface of the light-permeable sheet with respect to the substrate.

18. The sensor package structure according to claim 7, wherein the fillers in the first segment has a first density, and the fillers in the second segment has a second density that is less than the first density.

19. A manufacturing method of a sensor package structure, comprising:

a formation step implemented by recessing an outer surface of a light-permeable board to form a plurality of grooves, wherein the light-permeable board has an inner surface opposite to the outer surface, and defines a plurality of light-permeable sheets through the grooves;

a filling step implemented by forming a sacrificial layer on the light-permeable board, wherein the sacrificial layer is filled in an entirety of each of the grooves;

a slicing step implemented by slicing the sacrificial layer and the light-permeable board along the grooves to form the light-permeable sheets separated from each other and a plurality of sacrificial rings that are respectively attached onto the light-permeable sheets, wherein each of the light-permeable sheets has an avoidance slot that is arranged on a peripheral side of the outer surface and that is ring-shaped, and wherein the avoidance slot of each of the light-permeable sheets is fully filled with a corresponding one of the sacrificial rings;

a placing step implemented by providing a sensing module including a sensor chip and a ring-shaped supporting layer that is disposed on the sensor chip, and implemented by placing the inner surface of one of the light-permeable sheets onto the ring-shaped supporting layer;

a packaging step implemented by arranging a liquid compound on a substrate of the sensing module and solidifying the liquid compound to form an encapsulant that includes an adhesive and a plurality of fillers mixed in the adhesive, wherein the sensor chip is mounted on and electrically coupled to the substrate, and the encapsulant is divided into:

a first segment formed on the substrate, wherein the fillers are precipitated in the first segment, and the sensor chip, the ring-shaped supporting layer, and the light-permeable sheet are embedded in the first segment; and a second segment that is integrally connected to the first segment so as to form a filler settling boundary along a connection interface of the first segment and the second segment, wherein the second segment is connected to a lateral side of the sacrificial sheet, and an inner edge of the filler settling boundary is not in contact with the light-permeable sheet and surrounds the lateral side of the sacrificial sheet; and a removing step implemented by removing the sacrificial ring, whereby the substrate, the sensor chip, the ring-shaped supporting layer, the light-permeable sheet, and the encapsulant are jointly defined as a sensor package structure.

20. The manufacturing method according to claim 19, wherein, in the filling step, the sacrificial layer is made of a thermal release adhesive, an ultraviolet (UV) release adhesive, or a hydrolysis release adhesive.

* * * * *